(12) United States Patent
Tak et al.

(10) Patent No.: US 6,979,604 B2
(45) Date of Patent: Dec. 27, 2005

(54) METHOD FOR FORMING PATTERN ON SUBSTRATE AND METHOD FOR FABRICATING LIQUID CRYSTAL DISPLAY USING THE SAME

(75) Inventors: Young-Mi Tak, Seoul (KR); Woon-Yong Park, Suwon (KR); Jung-Ho Lee, Suwon (KR); Mun-Pyo Hong, Seongnam (KR); Kyuha Chung, Seoul (KR)

(73) Assignee: Samsung Electronics Co., Ltd., (KR)

( * ) Notice: Subject to any disclaimer, the term of this patent is extended or adjusted under 35 U.S.C. 154(b) by 39 days.

(21) Appl. No.: 10/469,495

(22) PCT Filed: Mar. 5, 2002

(86) PCT No.: PCT/KR02/00376

§ 371 (c)(1),
(2), (4) Date: Nov. 28, 2003

(87) PCT Pub. No.: WO03/060600

PCT Pub. Date: Jul. 24, 2003

(65) Prior Publication Data

US 2004/0095518 A1    May 20, 2004

(30) Foreign Application Priority Data

Dec. 11, 2001 (KR) ............................... 2001-78090

(51) Int. Cl.[7] ........................ H01L 21/475; G03C 5/56
(52) U.S. Cl. ................... 438/158; 438/708; 438/946; 430/312
(58) Field of Search ..................... 349/187; 430/5, 430/296, 312; 438/30, 151, 158, 609, 708, 438/946, 949

(56) References Cited

U.S. PATENT DOCUMENTS

| | | | |
|---|---|---|---|
| 5,897,978 A * | 4/1999 | Nakajima | 430/5 |
| 5,945,256 A * | 8/1999 | Kim et al. | 430/312 |
| 6,020,092 A | 2/2000 | Sakoh | 430/5 |
| 6,204,912 B1 * | 3/2001 | Tsuchiya et al. | 355/53 |
| 6,798,477 B2 * | 9/2004 | Yoo et al. | 349/113 |

FOREIGN PATENT DOCUMENTS

JP    11-250760    9/1999

OTHER PUBLICATIONS

PCT International Search Report; International application No. PCT/KR0200376, International filing date: Mar. 5, 2002; Date of Mailing: Sep. 26, 2002.

* cited by examiner

Primary Examiner—Stephen W. Smoot
(74) Attorney, Agent, or Firm—Cantor Colburn LLP

(57) ABSTRACT

The present invention relates to a method of forming a pattern on a substrate and a method of manufacturing a liquid crystal display panel using the same. In order to decrease stitch defect, the shot boundary lines for respective layers of patterns do not overlap each other to be dispersed. Specifically, according to a method of forming patterns of the present invention, after a first material layer is first formed on a substrate, a first pattern is formed by performing a first photo etching including divisional light exposure with at least two areas across at least one shot boundary line on the first material layer. Subsequently, after a second material layer is formed on the first pattern, a second pattern is formed by performing a second photo etching including divisional light exposure with at least two areas across at least one shot boundary line on the second material layer. The shot boundary line in the second photo etching is spaced apart from the shot boundary line in the first photo etching. A liquid crystal display panel is manufactured by using this forming method.

12 Claims, 7 Drawing Sheets

METHOD FOR FORMING PATTERN ON SUBSTRATE AND METHOD FOR FABRICATING LIQUID CRYSTAL DISPLAY USING THE SAME

BACKGROUND OF THE INVENTION (a) Field of the Invention

The present invention relates to a method of forming a pattern on a substrate and a method of manufacturing a liquid crystal display panel using the same.

(b) Description of the Related Art

Generally, a liquid crystal display (LCD) includes two panels provided with electrodes, and a liquid crystal layer interposed between the two panels. The electrodes generate electric field to be applied to the liquid crystal layer interposed between the panels and the LCD displays images by adjusting the field strength to control the transmittance of light passing through the panels.

Photo etching processes are performed to form various patterns on the panels of the LCD through light exposure using a stepper or an aligner.

The stepper uses a small mask suitable for its equipment characteristics and the light exposure is performed by partitioning the panel into several shots and exposing the shots to light While moving the panel to up ward and downward and right and left under the mask for the stepper. The mask for the stepper is aligned with the panel by aligning the mask with the stepper and aligning the panel with the stepper.

The aligner exposes the entire area of the panel to light with one shot using a large mask in accordance with the equipment characteristics. At that time, after a mask for the aligner is aligned with the aligner, the panel is aligned with the mask for the aligner. When the LCD is manufactured, the aligner profitable to the production line manufacturing large panels is adapted.

However, as the LCD panel to be manufactured becomes too large to use the conventional aligner, it becomes hard to expose the large LCD to light by one shot using one mask. The mask exposure is accomplished by repeating a divisional exposure. One divisional exposure unit or area is called a shot.

Since transition, rotation, distortion, and etc. are generated during light exposure, the shots are not aligned accurately. Accordingly, parasitic capacitances generated between wires and pixel electrodes differ depending on the shots, and this causes the bright difference between the shots, which is recognized at the pixels located at a boundary between the shots. Therefore, the stitch defect is generated on the screen of the LCD due to brightness discontinuity between the shots.

Thus, when a large LCD is manufactured from a large panel, the stitch defect is inevitable even though the exposure process is performed using the aligner. In particular, the exposure processes for forming the respective patterns of the LCD use respective masks which give the same shots. Accordingly, the boundaries of the shots for the respective patterns coincide to multiply generate the stitch defect of the display.

SUMMARY OF THE INVENTION

It is an object of the present invention to provide a method of forming patterns and a method of manufacturing an LCD panel using the same, which decrease the stitch defect.

To accomplish the object, the boundaries between the shots in the exposure processes for forming respective patterns do not overlap to be different.

Specifically, in a method of forming patterns according to an embodiment of the present invention, after a first material layer is first formed, a first pattern is formed by performing a first photo etching including divisional light exposure with at least two areas across at least one shot boundary line on the first material layer. Subsequently, after a second material layer is formed on the first pattern, a second pattern is formed by performing a second photo etching including divisional light exposure with at least too areas across at least one shot boundary line on the second material layer, the at least one shot boundary line in the second photo etching spaced apart from the at least one shot boundary line in the first photo etching.

The present invention may further includes formation of a material layer on the first and the second patterns and formation of a pattern by performing a photo etching including divisional light exposure with at least two areas across at least one shot boundary line on the material layer, the at least one shot boundary line in the photo etching spaced apart from the at least one shot boundary line in the first photo etching and the at least one shot boundary line in the second photo etching. The formation of a material layer and the formation of a pattern may be repeated to form a plurality of patterns.

In a method of manufacturing a liquid crystal display panel according to another embodiment of the present invention, after a first metal layer is first formed on a substrate, a gate wire including a gate line and a gate electrode is formed by performing a first photo etching including divisional light exposure with at least two areas across at least one first shot boundary line on the first metal layer. Subsequently, a gate insulating film is formed on the gate wire. After forming a semiconductor layer on the gate insulating layer, a semiconductor pattern is formed by performing a second photo etching including divisional light exposure with at least two areas across at least one second shot boundary line on the semiconductor layer, the at least one second shot boundary line spaced apart from the at least one first shot boundary line. Next, after a second metal layer is formed on the gate insulating film and the semiconductor pattern, a data wire including a data line, source and drain electrodes is formed by performing a third photo etching including divisional light exposure with at least two areas across at least one third shot boundary line on the second metal layer, the at least one third shot boundary line spaced apart from the at least one first and second boundary lines. After forming a passivation film on the semiconductor pattern and the data wires, a contact hole exposing the drain electrode is formed by performing a fourth photo etching including divisional light exposure with at least two areas across at least one fourth shot boundary line on the passivation film; the at least one fourth shot boundary line spaced apart from the at least one first to third boundary lines. Subsequently, after a transparent conductive layer is formed on the passivation film and the drain electrode and forming a pixel electrode connected to the drain electrode is formed by performing a fifth photo etching including divisional light exposure with at least two areas across at least one fifth shot boundary line on the transparent conductive layer, the at least one fifth shot boundary line spaced apart from the at least one first to fourth boundary lines.

Each of the first to the fifth photo etching may be performed by using one mask. The mask may include a first mask pattern defining an exposure area at a central portion of the substrate, and second and third mask patterns defining exposure areas at a left portion and a right portion, respectively. According to an embodiment of the present invention, widths of at least two of the first to the third mask patterns on at least two of the masks are different. According to another embodiment of the present invention, the number of shots in the light exposure using the first mask pattern for at least two of the first to the fifth photo etchings is different. According to another embodiment of the present invention, at least one of the first to the third mask patterns in at least two of the masks has at least two sub mask patterns.

A black matrix is preferably formed by forming a material layer for a black matrix on an opposite substrate facing the substrate and then performing a sixth photo etching including divisional light exposure with at least two areas across at least one sixth shot boundary line on the material layer for a black matrix, the at least one sixth shot boundary line spaced apart from the at least one first to fifth boundary lines.

A common electrode is preferably formed by forming a transparent conductor layer on an opposite substrate facing the substrate and then performing a sixth photo etching including divisional light exposure with at least two areas across at least one sixth shot boundary line on the transparent conductor layer, the at least one sixth shot boundary line spaced apart from the at least one first to fifth boundary lines.

DETAILED DESCRIPTION OF PREFERRED EMBODIMENTS

Embodiments of the present invention will be described with reference to the accompanying drawings.

FIGS. 1A to 1E are layout views of an LCD panel showing shot boundaries between partitioned areas for respective layers of patterns in a manufacturing method thereof according to a first embodiment of the present invention. This embodiment performs five exposure processes for forming the layers of patterns.

Figure 1A:
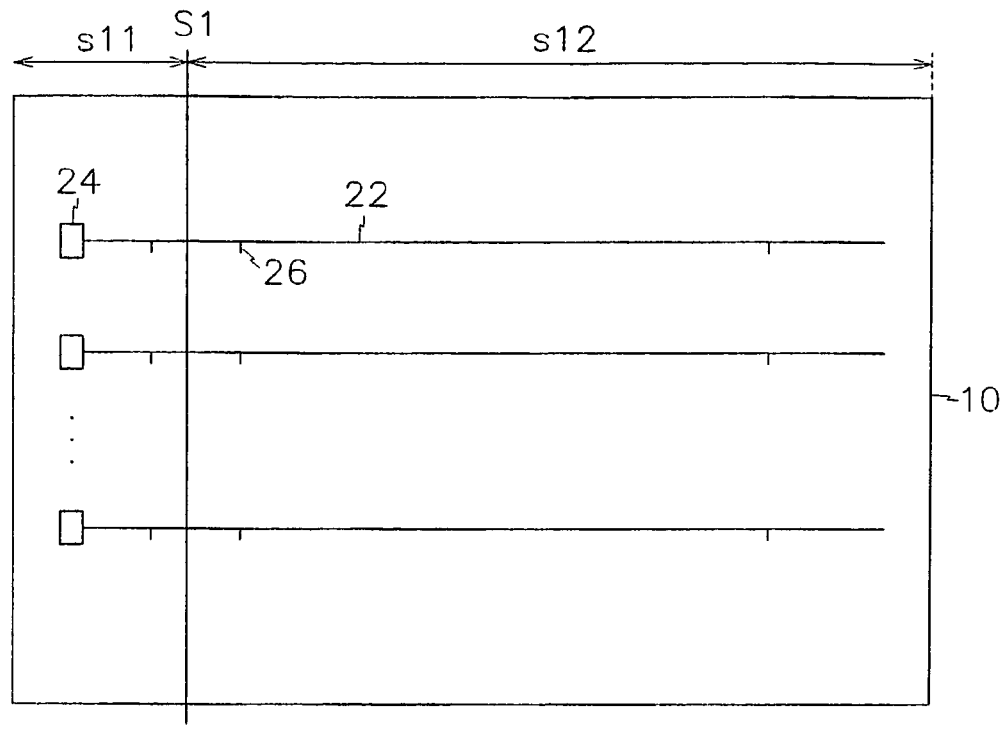
FIGS. 1A to 1E are layout views of an LCD panel showing shot boundaries between partitioned areas for respective layers of patterns in a manufacturing method thereof according to a first embodiment of the present invention.

As shown in FIG. 1A, a gate metal layer is deposited on an insulating substrate 10, and is patterned by a first photo etching step to form a gate wire including a plurality of gate lines 22, a plurality of gate pads 24, and a plurality of gate electrodes 26.

In the first photo etching step, a photoresist film is applied on the entire surface of the gate metal layer and is subject to divisional light exposure with at least too shots using a gate mask. The position of a shot boundary line S1 between partitioned areas is determined in accordance with sizes of the partitioned areas exposed to light at respective shots.

The gate wire 22, 24 and 26 in the respective partitioned exposure areas s11 and s12 adjacent to each other across the boundary line S1 may not match each other to cause high probability of misalignment errors. This is due to the misalignment of the two shots.

Figure 1B:
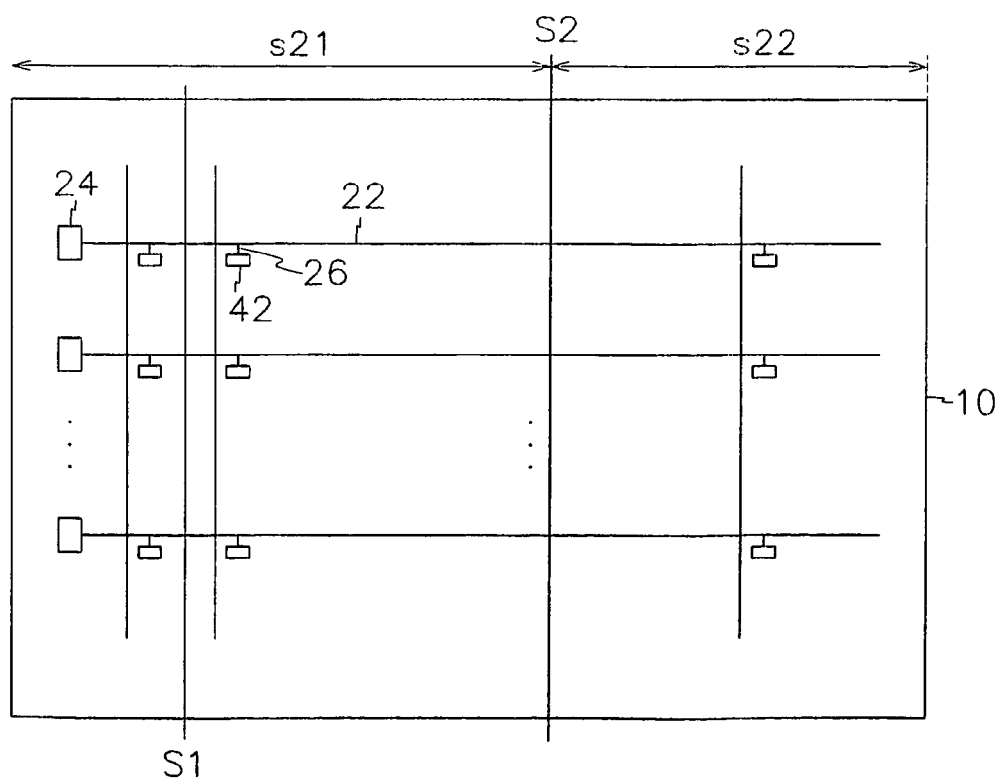

As shown in FIG. 1B, a gate insulating film (not shown) is deposited on the insulating substrate 10 with the gate wires 22, 24 and 26. Thereafter, an amorphous silicon layer is deposited on the gate insulating film, and is patterned by a second photo etching step to form a plurality of semiconductor patterns 42.

In the second photo etching step, a photoresist film coated on the entire surface of the substrate is subject to divisional light exposure with at least two shots using a semiconductor pattern mask. At this time, a shot boundary line S2 for the semiconductor patterns does not overlap the shot boundary line S1 for the gate wire.

The semiconductor patterns 42 in the respective partitioned exposure areas s21 and s22 adjacent to each other across the boundary line S2 may not match each other to cause high probability of misalignment errors. Furthermore, coupling capacitances generated between the semiconductor patterns 42 and the gate lines 22 in the respective partitioned exposure areas s21 and s22 across the boundary line S2 are probably different.

Figure 1C:
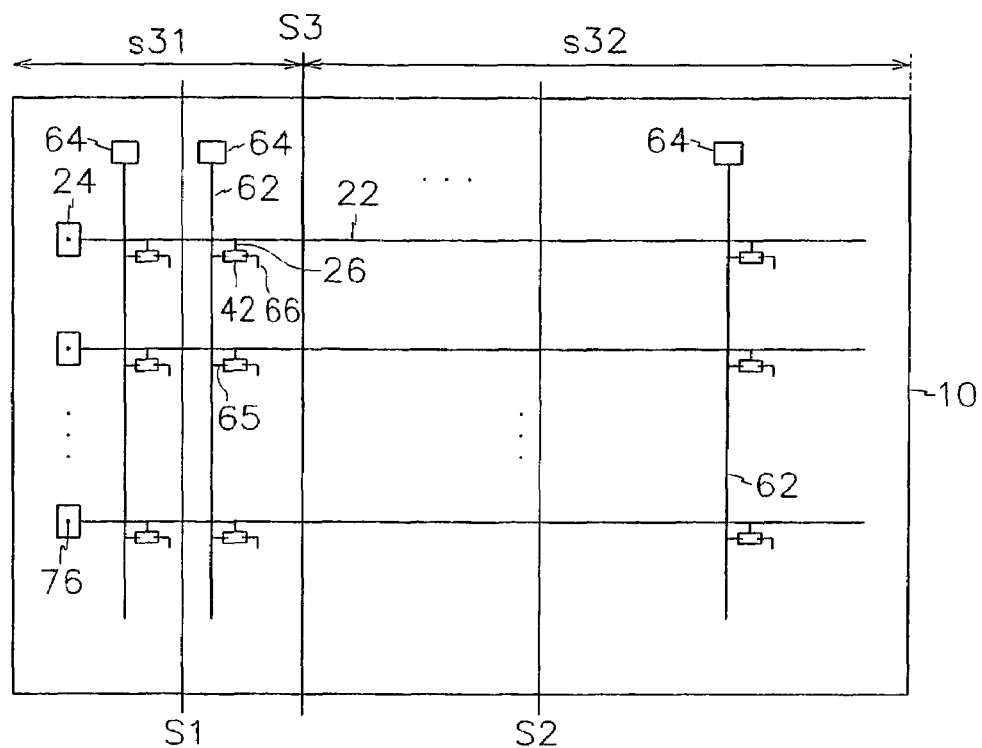

As shown FIG. 1C, a data metal layer is deposited on the substrate with the semiconductor pattern 42 and is patterned by a third photo etching step to form a data wire including a plurality of data lines 62, a plurality of data pads 64, a plurality of source electrodes 65, and a plurality of drain electrodes 66.

In the third photo etching step, a photoresist film coated on the entire surface of the substrate is subject to divisional light exposure with at least two shots using a data mask. At this time, a boundary line S3 for the data wire does not overlap the shot boundary line S1 for the gate wire and the shot boundary line S2 for the semiconductor pattern.

The data wires 62, 64, 65 and 66 in the respective partitioned exposure areas s31 and s32 adjacent to each other across the boundary line S3 may not match each other to cause high probability of misalignment errors. Furthermore, coupling capacitances generated between the data lines 62 and the gate lines 22 and the gate electrodes 26 and generated between the data lines 62 and the semiconductor patterns 42 in the respective partitioned exposure areas s31 and s32 across the boundary line S3 are probably different.

Figure 1D:
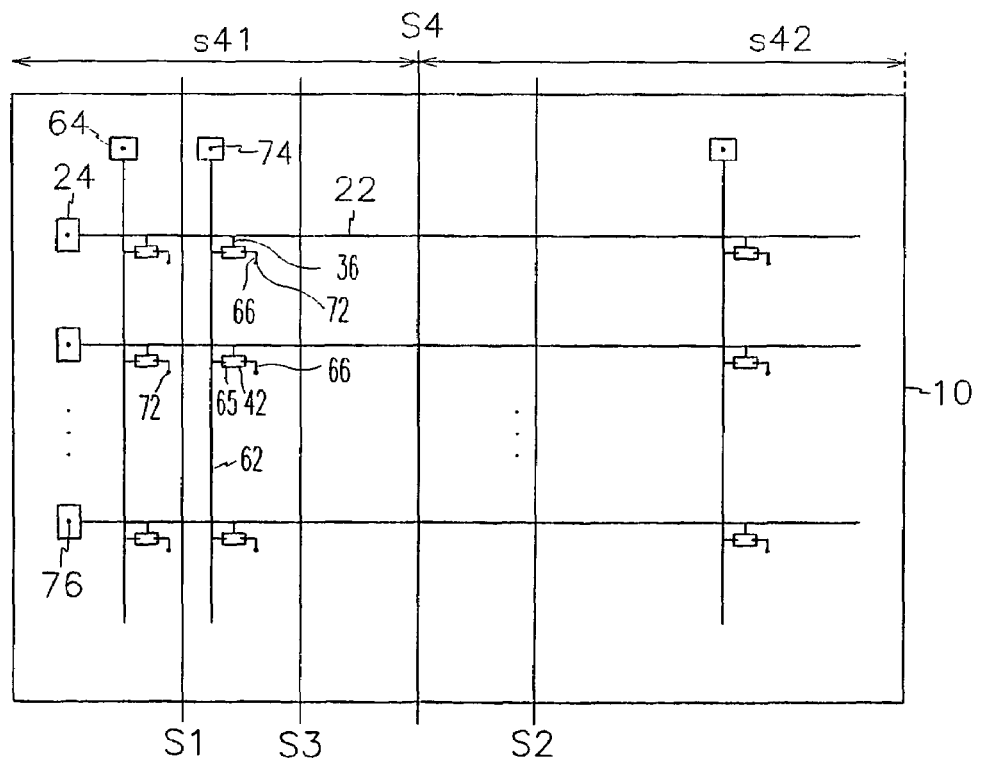

As shown FIG. 1D, a passivation film (not shown) is deposited on the substrate with the data wires 62, 64, 65 and 66, and the passivation film and the gate insulating film are patterned by a fourth photo etching step to form a plurality of contact holes 72, 74 and 76 exposing the drain electrodes 66, the data pads 64 and the gate pads 24, respectively.

In the fourth photo etching step, a photoresist film coated on the entire surface of the substrate is subject to divisional light exposure with at least two shots using a contact hole mask. At this time, a shot boundary line S4 for the contact holes does not to overlap the shot boundary line S1 for the gate wire, the shot boundary line S2 for the semiconductor patterns, and the shot boundary line S3 for the data wire. The patterns of the contact holes 72, 74, and 76 in the respective partitioned exposure areas s41 and s42 adjacent to each other across the boundary line S4 may not match each other to cause high probability of misalignment errors.

Figure 1E:
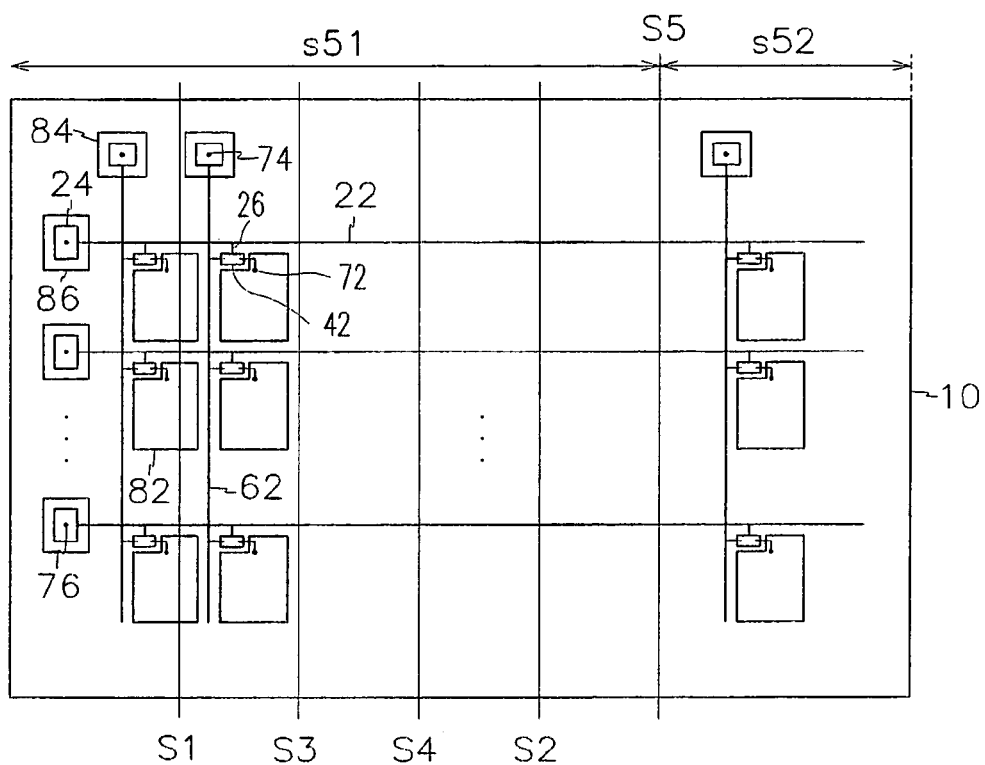

As shown FIG. 1E, a pixel conductive layer is deposited on the substrate with the contact holes 72, 74 and 76, and is patterned by a fifth photo etching step to form a pixel wire including a plurality of pixel electrodes 82, a plurality of auxiliary data pads 84, and a plurality of auxiliary gate pads 86.

In the fifth photo etching step, a photoresist film coated on the entire surface of the substrate is subject to divisional light exposure with at least two shots using a pixel mask. At this time, a shot boundary line S5 for the pixel wire does not overlap the shoot boundary line S1 for the gate wire, the shot boundary line S2 for the semiconductor patterns, the shot boundary line S3 for the data wire, and the shoot boundary line S4 for the contact holes.

The patterns of the pixel wire 82, 84 and 86 in the respective partitioned exposure areas s51 and s52 adjacent to each other across the boundary line S5 may not match each other to cause a high probability of misalignment errors.

According to the first embodiment of the present invention, stitch errors are dispersed over the entire display area by dispersing the shot boundary lines in the exposure processes for forming the respective patterns not to overlap each other. Therefore, image degradation due to the concentration of the stitch defects is prevented.

The method of manufacturing an LCD according to the first embodiment of the present invention described above includes exemplary five photo etching steps. However, the dispersion of the shot boundary lines in the exposure processes for forming the respective patterns may be adapted to the photo etching steps for forming any pattern. For example, a boundary line between the shots in a photo etching process for forming a black matrix on an upper substrate of an LCD does not overlap the shot boundary lines in the lower substrate. The technique may be adapted to a step for forming cutouts in a common electrode of the upper panel in order to obtain wide viewing angle in a vertically-aligned type LCD having liquid crystal molecules aligned perpendicular to the panels.

Figure 2:
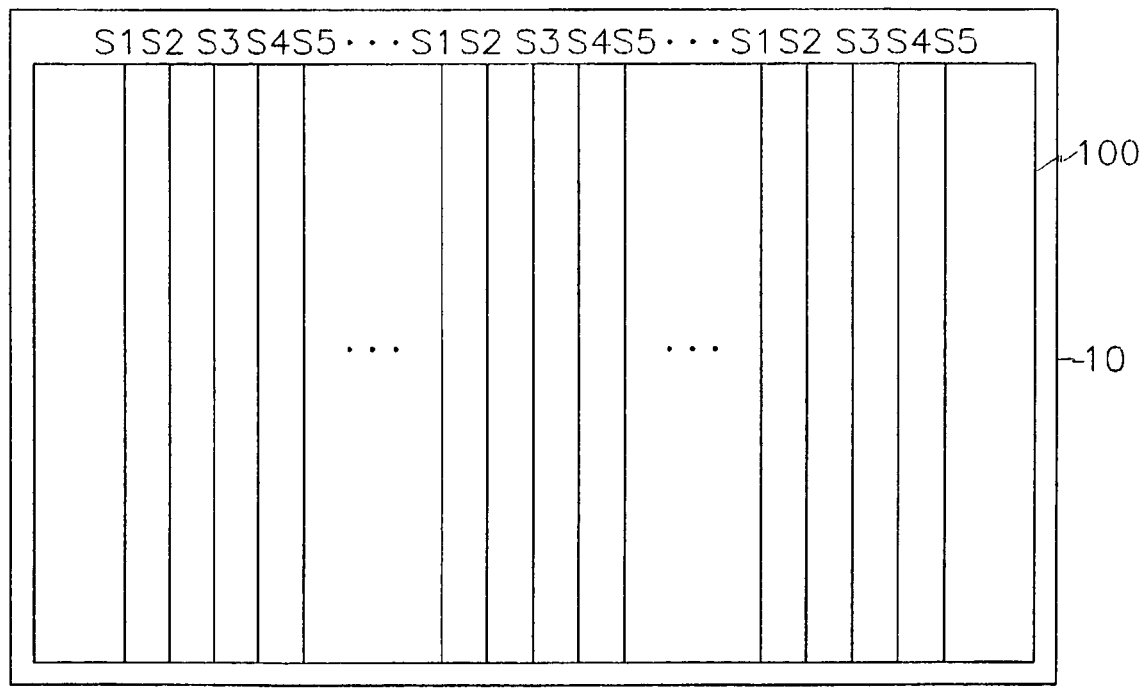
FIG. 2 is a schematic diagram of an LCD panel showing all boundary lines between partitioned areas in a manufacturing method thereof according to a second embodiment of the present invention.

FIG. 2 is a schematic diagram of an LCD panel showing boundary lines between partitioned areas for all patterns in a manufacturing method thereof according to a second embodiment of the present invention;

When an LCD panel 100 is subject to divisional exposure, the shot boundary lines S1, S2, S3, S4 and S5 formed for respective patterns do not overlap each other.

Accordingly, the embodiments of the present invention minimize the deterioration of image quality by dispersing stitch errors over the entire display area such that the shot boundary lines in the exposure processes for forming the respective patterns do not to overlap each other.

Furthermore, a plurality of mask patterns may be formed on one mask and the size of the exposure area is defined by the mask patterns.

Figure 3:
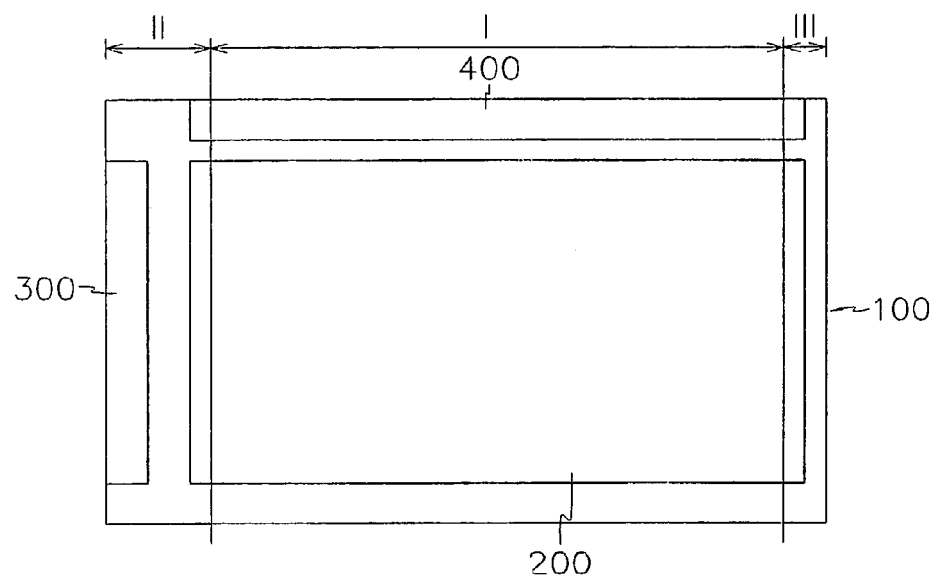
FIG. 3 is a schematic diagram of an LCD panel.

As shown in FIG. 3, an LCD has a display area 200 occupying most area of the LCD panel 100, and a gate driving circuit area 300 and a data driving circuit area are located on the left side and on the upper side of the display area 200, respectively.

A plurality of pixel areas having the same pattern are arranged in a matrix on the display area 200, and a plurality of circuit patterns having the same pattern are repeatedly arranged on the gate driving area 300 and the data driving circuit area 400.

According to an embodiment of the present invention, the exposure areas in the exposure processes are determined by the above-described patterns of the LCD.

Referring to FIG. 3, in manufacturing methods of an LCD according to third to fifth preferred embodiments of the present invention, the substrate for the LCD is partitioned into a central portion I, a left portion II, and a right portion III, which are subject to the light exposing processes using different mask patterns. For the central portion I having the same patterns repeatedly formed, a light exposing process includes a plurality of repeatedly-performed shots using a mask pattern having a width smaller than that of the central portion I. However, for the left portion II and the right portion III, each light exposing process includes only one shot made by using a mask pattern having a width equal to that of the mask pattern. The sizes of the central portion I, the left portion II, and the right portion III are appropriately determined by light exposing conditions in the light exposing processes.

The mask patterns for forming the patterns on the central portion I, the left portion II, and the right portion III of the LCD panel are provided on one mask, and thereby the light exposing processes for the large-sized LCD panel 100 are performed using one mask.

Figure 4:
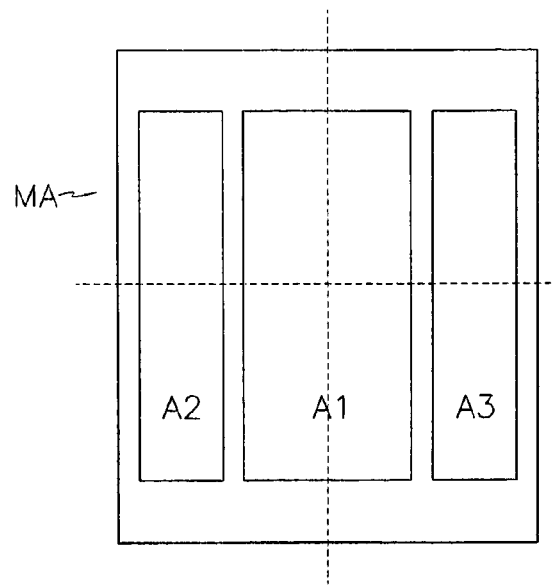
FIG. 4 is a schematic diagram of a first mask used in an exposure process for a method of manufacturing an LCD according to third, fourth, and fifth embodiments of the present invention.
Figure 5:
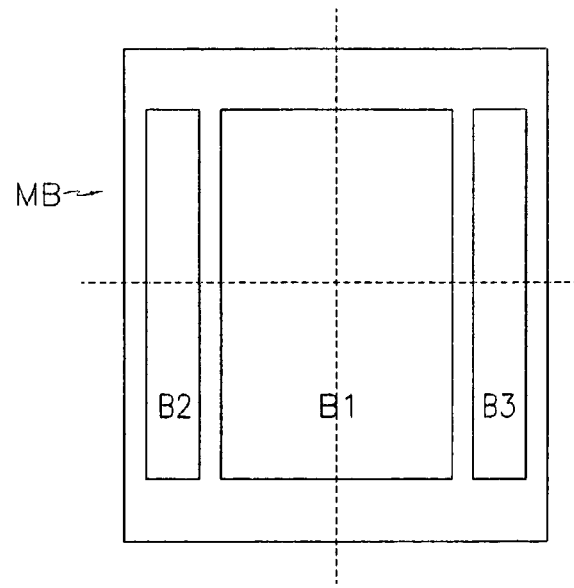
FIG. 5 is a schematic diagram of a second mask used in an exposure process for a method of manufacturing an LCD according to the third embodiment of the present invention.
Figure 6:
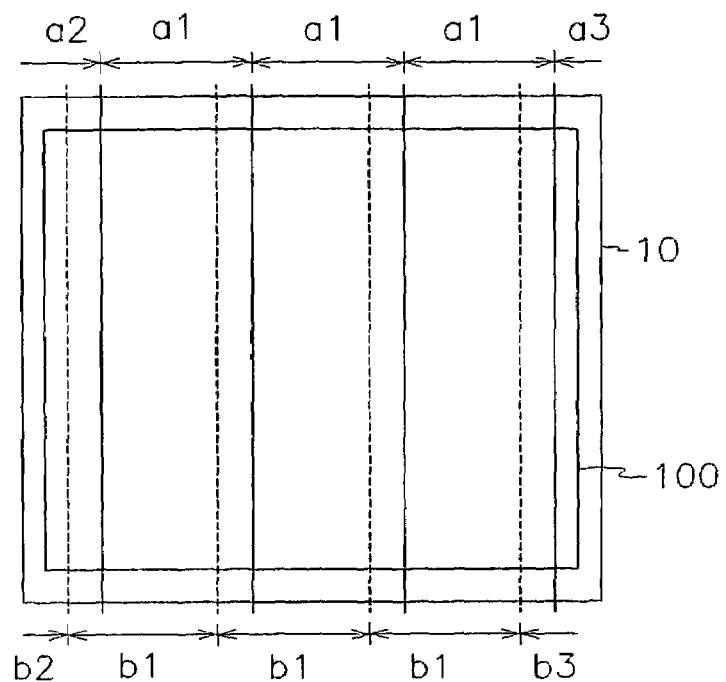
FIG. 6 is a schematic diagram of an LCD panel, which shows boundary lines between exposure areas through the first and the second masks in an exposure process for a method of manufacturing an LCD according to the third embodiment of the present invention.

FIGS. 4, 5 and 6 illustrate light exposing processes for manufacturing an LCD panel according to the fourth embodiment of the present invention. FIGS. 4 and 5 are schematic diagrams of first and second masks for exposure processes for manufacturing an LCD, respectively, and FIG. 6 is a schematic diagram of an LCD panel, which shows exposure area s defined by the first and the second masks respectively shown in FIGS. 4 and 5.

Light exposing processes in an exemplary method of manufacturing an LCD panel according to the third embodiment of the present invention will be described with reference to FIGS. 3 to 6.

For convenience of description, the exemplary method forms two layers of patterns on one substrate 10 to manufacture one LCD panel 100.

This embodiment determines the widths of the mask patterns such that the number of the shots for the respective layers is equal to each other to disperse the shot boundary lines.

A first mask MA for a first layer shown in FIG. 4 has first to third mask patterns A1, A2 and A3 respectively used for the central portion I, the left portion II, and the right portion III of the LCD panel 100.

The widths of the respective mask patterns A1, A2 and A3 are preferably determined such that the width of the LCD panel except for second and third exposure areas a2 and a3 defined by the second and the third mask patterns A2 and A3 is equal to multiples of that of the first exposure area a1 defined by the first mask pattern A1. In this embodiment, the widths of the respective mask patterns are determined such that three first exposure areas a1 are formed.

When the substrate 10 is exposed to light using the first mask MA, one second exposure area a2, and one third exposure area a3 are formed while three first exposure areas a1 are formed as shown in FIG. 6. Solid lines represent the boundary lines between the exposure areas formed by using the first mask MA.

A second mask MB for a second layer shown in FIG. 5 has first to third mask patterns B1, B2 and B3 respectively used for the central portion 1, the left portion II, and the right portion III of the LCD panel 100.

The widths of the respective mask patterns B1, B2 and B3 are preferably determined such that the width of the LCD panel 100 except for second and third exposure areas b2 and b3 defined by the second and the third mask patterns B2 and B3 is equal to multiples of that of the first exposure area b1 defined by the first mask pattern B1.

In this embodiment, the widths of the respective mask patterns are determined such that three first exposure areas a1 are formed.

The widths of the first to the third mask patterns B1, B2 and B3 in the second mask MB and the widths of the first to the third mask patterns A1, A2, and A3 in the first mask MA are adequately determined such that the number of the shots for the respective layers is equal to each other to disperse the shot boundary lines.

For example, the widths of the mask patterns A1, A2 and A3; B1, B2 and B3 in the first and the second masks MA and MB are determined such that the widths of the mask patterns A1, A2 and A3 in the first mask MA are smaller than, equal to, or larger than the widths of the mask pattern B1, B2, and B3 in the second mask MA. It is apparent that the widths of the mask patterns A1, A2 and A3 in the first mask MA cannot be equal to the widths of the mask patterns B1, B2 and B3 in the second mask MB, respectively.

In this embodiment, the width of the first mask pattern B1 in the second mask MB is larger than that of the first mask pattern A1 of the first mask MA while the widths of the second and the third mask patterns B2 and B3 are smaller than the widths of the second and the third mask patterns A2 and A3 in the first mask MA, respectively.

When the substrate 10 is exposed to light using the second mask MB, one second exposure area b2, and one third exposure area b3 are formed while three first exposure areas b1 are formed as shown in FIG. 6. Dotted lines represent the boundary lines between the exposure areas formed by using the second mask MB.

The number of the shots to be made on the substrate 10 by using the second mask MB is equal to that by using the first mask MA.

However, since the widths of the first to the third mask patterns B1, B2, and B3 in the second mask MB are different from the widths of the first to the third mask patterns A1, A2, and A3 in the first mask MA, the boundary lines between the exposure areas may be dispersed even if the light exposing processes are made by using the respective masks with the same number.

Although the above example is described to form two layers of patterns for convenience of description, the present invention is also suitable for the light exposing processes for forming three layers of patterns. To summarize, the third embodiment of the present invention differentiates the widths of mask patterns such that the shot boundary lines in the respective light exposing processes for different layers of patterns do not match each other.

Figure 7:
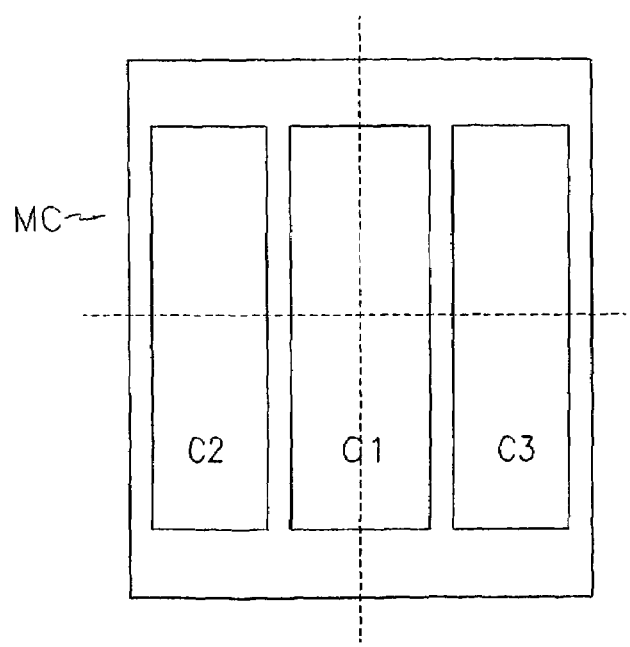
FIG. 7 is a schematic diagram of a third mask used in an exposure process for a method of manufacturing an LCD according to the fourth embodiment of the present invention.
Figure 8:
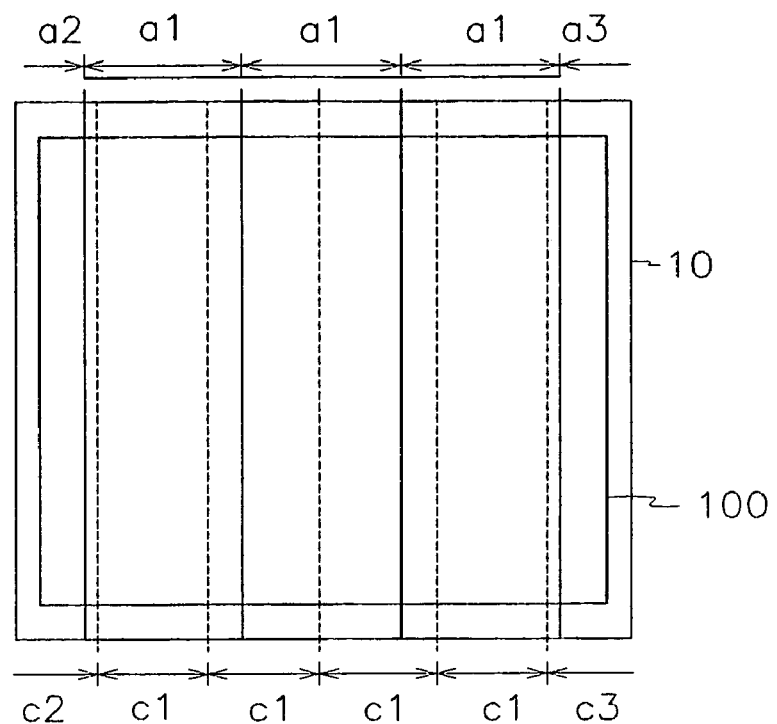
FIG. 8 is a schematic diagram of an LCD panel, which shows boundary lines between exposure areas through the first and the third masks in an exposure process for a method of manufacturing an LCD according to the fourth embodiment of the present invention.

FIGS. 7 and 8 illustrate light exposing processes for manufacturing an LCD panel according to the fourth embodiment of the present invention. FIG. 7 is a schematic diagram of a third mask for the exposure processes for manufacturing the LCD, and FIG. 8 is a schematic diagram of an LCD panel, which shows exposure areas defined by the first and the third masks respectively shown in FIGS. 4 and 7.

Light exposing processes in an exemplary method of manufacturing an LCD panel according to the fourth embodiment of the present invention will be described with reference to the FIGS. 3, 4, 7 and 8.

For convenience of description, the exemplary method forms two layers of patterns on one substrate 10 to manufacture one LCD panel 100.

This embodiment determines the widths of the mask patterns such that the number of the shots for the respective layers is equal to each other to disperse the shot boundary lines.

It has been already described that a first layer of patterns is formed by using the first mask MA in the third embodiment of the present invention. Solid no lines represent exposure areas a1, a2, and a3 of the substrate 10 formed by using the first mask MA.

The third mask MC shown in FIG. 7 is used for forming a second layer of patterns. The third mask MC has first to third mask patterns C1, C2, and C3 respectively used for the central portion I, the left portion II, and the right portion III of the LCD panel 100.

The widths of the respective mask patterns C1, C2 and C3 are preferably determined such that the width of the LCD panel 100 except for second and third exposure areas c2 and c3 defined by the second and the third mask patterns C2 and C3 is equal to multiples of that of the first exposure area c1 defined by the first mask pattern C1. In this embodiment, the widths of the respective mask patterns are determined such that four first exposure areas c1 are formed.

The widths of the first to the third mask patterns C1, C2 and C3 in the third mask MC are different from the widths of the first to the third mask patterns A1, A2 and A3 in the first mask MA.

In this embodiment, the width of the first mask pattern C1 in the mask MC is smaller than the width of the first mask pattern A1 in the first mask MA.

As shown in FIG. 8, ashen the substrate 10 is exposed to light using the third mask MC, one second exposure area c2, and one third exposure area c3 are formed while four first exposure areas c1 are formed. Dotted lines represent the boundary lines between the exposure areas formed by using the third mask MC.

The number of the shots to be made by using the third mask MC differs from that by using the first mask MA. Since the widths of the first to the third mask patterns C1, C2 and C3 in the third mask MC differ from the widths of the first to the third mask patterns A1, A2 and A3 in the first mask MA, the shot boundary lines are dispersed.

Although the above example is described to form two layers of patterns for convenience of description, the present invention is also suitable for the light exposing processes for forming three layers of patterns. To summarize, the fourth embodiment of the present invention differentiates the widths of mask patterns such that the shot boundary lines in the respective light exposing processes for different layers of patterns do not match each other.

Figure 9:
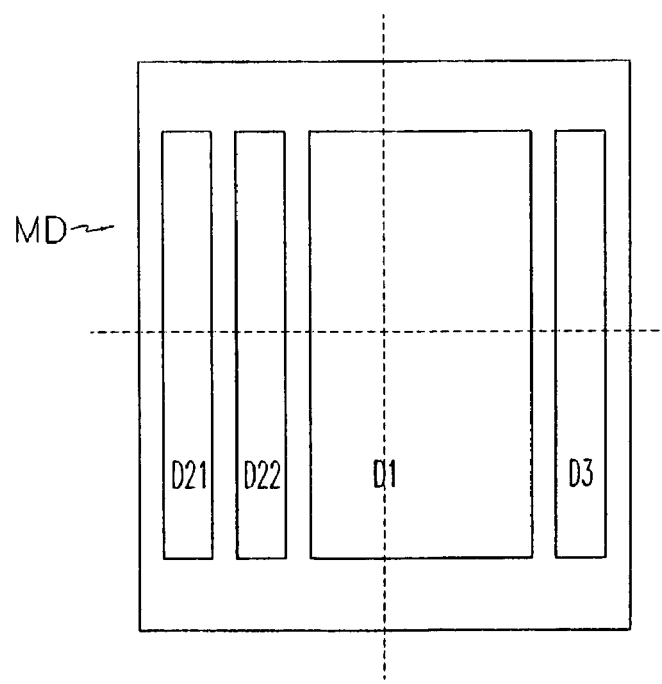
FIG. 9 is a schematic diagram of a fourth mask used in an exposure process for a method of manufacturing an LCD according to the fifth embodiment of the present invention.
Figure 10:
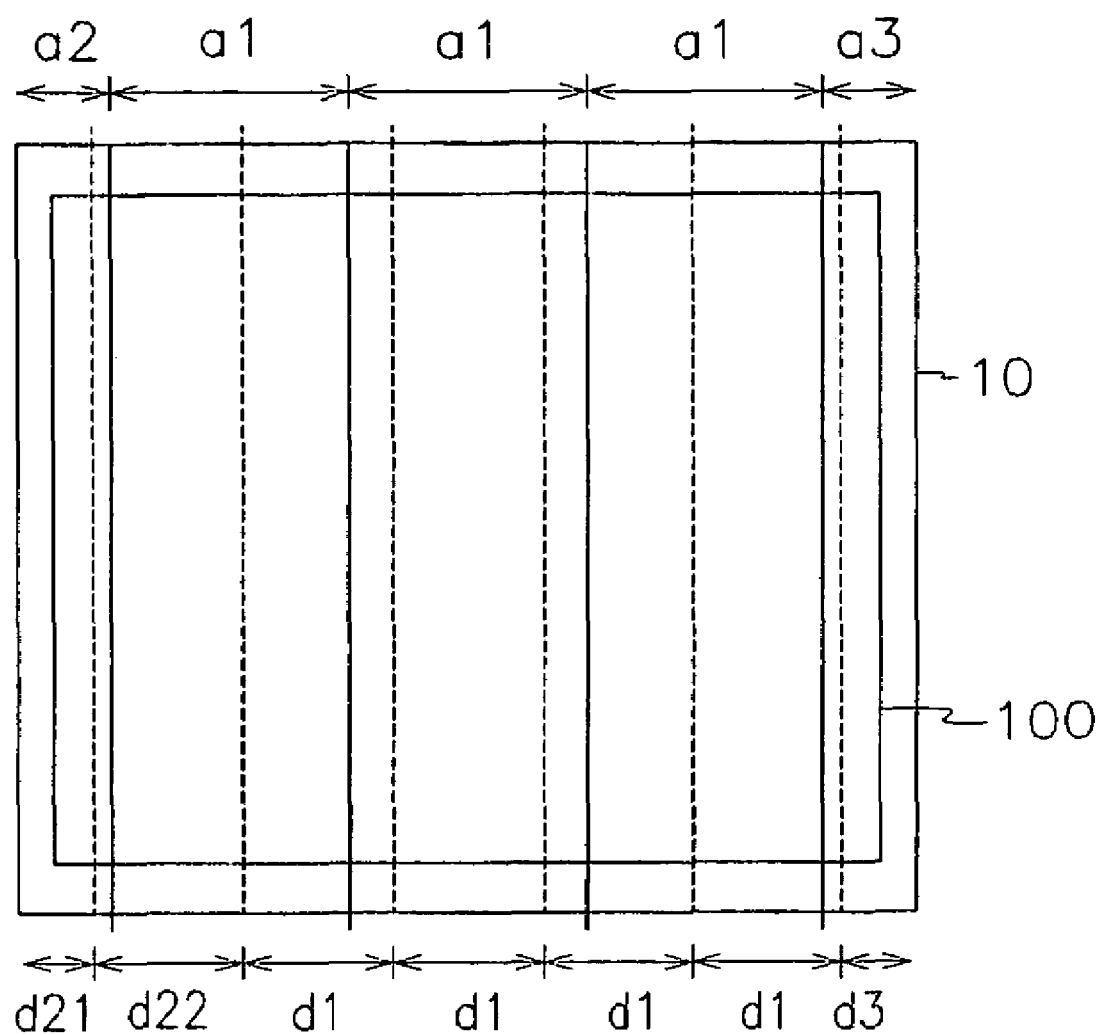
FIG. 10 is a schematic diagram of an LCD panel, which shows boundary lines between exposure areas through the first and the fourth masks in an exposure process for a method of manufacturing an LCD according to the fifth embodiment of the present invention.

FIGS. 9 and 10 illustrate light exposing processes for manufacturing an LCD panel according to the fifth embodiment of the present invention. FIG. 9 is a schematic diagram of a fourth mask for the exposure processes for manufacturing the LCD, and FIG. 10 is a schematic diagram of an LCD panel, which shows exposure areas defined by the first and the fourth masks respectively shown in FIGS. 4 and 9.

Light exposing processes in an exemplary method of manufacturing an LCD panel according to the fifth embodiment of the present invention will be described with reference to the FIGS. 3, 4, 9 and 10.

For convenience of description, the exemplary method forms two layers of patterns on one substrate 10 to manufacture one LCD panel 100.

This embodiment differentiates the number of mask patterns provided on different masks to disperse shot boundary lines.

It has been already described that a first layer of patterns is formed by using the first mask MA in the third embodiment of the present invention. Solid lines represent exposure areas a1, a2, and a3 of the substrate 10 formed by using the first mask MA.

The fourth mask MD shown in FIG. 9 is used for forming a second layer of patterns. The fourth mask MD has a first mask pattern D1 used for the central portion I, a first type second mask pattern D21 and a second type second mask pattern D22 used for the left portion II, and a third mask pattern D3 used for the right portion III of the LCD. The mask pattern of the fourth mask pattern MD used for exposing the left portion II to light is partitioned into two sub mask patterns D21 and D22.

At that time, the widths of the respective mask patterns D1, D21, D22 and D3 are preferably determined such that the width of the LCD panel 100 except for first and second type second exposure areas d21 and d22 and a third exposure area d3 defined by the first and second type second mask pattern D21 and D22 and the third mask pattern D3 is equal to multiples of that of the first exposure area d1 defined by the first mask pattern D1. In this embodiment, the widths of the respective mask patterns are determined such that four first exposure areas d1 are formed.

As shown in FIG. 10, when the substrate 10 is exposed to light using the fourth mask MD, one first type second exposure area d21, one second type second exposure area d22, and one third exposure area d3 are formed while four first exposure areas d1 are formed. Dotted lines represent the boundary lines between the exposure areas formed by using the fourth mask MD.

The number of the shots to be made by using the fourth mask MD differs from that by using the first mask MA. Since the number of the mask patterns of the fourth mask MD differ from that of the first mask MA, the shot boundary lines are dispersed.

Although the above example is described to form two layers of patterns for convenience of description, the present invention is also suitable for the light exposing processes for forming three layers of patterns. To summarize, the fifth embodiment of the present invention differentiates the number of mask patterns such that the number of the shots and the shot boundary lines in the respective light exposing processes for different layers of patterns do not match each other.

The fifth embodiment of the present invention provides the two sub mask patterns on portions where the mask patterns for exposing the left portion II to light are positioned. However, the number of the sub mask patterns according to the present invention is not limited. A plurality of the sub mask patterns may be formed at positions where the mask patterns for the light exposure of the central portion I or the right portion III are positioned.

The dispersion of the shot boundary lines in the exposure processes for forming the respective layers of patterns may be adapted to the photo etching steps for forming any pattern. For example, a boundary line between the shots in a photo etching process for forming a black matrix on an upper substrate of an LCD does not overlap the shot boundary lines in the lower substrate. The present invention may be adapted to a step for forming cutouts in a common electrode of the upper panel in order to obtain wide viewing angle in a vertically-aligned type multi-domain LCD having liquid crystal molecules aligned perpendicular to the panels.

As described above, the present invention prevents the overlapping of the shot boundaries between the exposure areas for the respective layers of patterns in photo etching processes. Therefore, image quality is improved by reducing stitch defect due to the overlapping of the shot boundaries.

What is claimed is:

1. A method of forming patterns, comprising:
   forming a first material layer;
   forming a first pattern by performing a first photo etching including divisional light exposure with at least two areas across at least one shot boundary line on the first material layer;
   forming a second material layer on the first pattern; and
   forming a second pattern by performing a second photo etching including divisional light exposure with at least two areas across at least one shot boundary line on the second material layer, the at least one shot boundary line in the second photo etching spaced apart from the at least one shot boundary line in the first photo etching,
   wherein the number of shots for the first pattern is different from the number of shots for the second pattern.

2. The method of claim 1, further comprising
   forming a material layer on the first and the second patterns; and
   forming a pattern by performing a photo etching including divisional light exposure with at least two areas across at least one shot boundary line on the material layer, the at least one shot boundary line in the photo etching spaced apart from the at least one shot boundary line in the first photo etching and the at least one shot boundary line in the second photo etching.

3. The method of claim 2, wherein the formation of a material layer and the formation of a pattern are repeated to form a plurality of patterns.

4. A method of manufacturing a liquid crystal display panel, comprising:
   forming a first metal layer on a substrate;
   forming a gate wire including a gate line and a gate electrode by performing a first photo etching including divisional light exposure with at least two areas across at least one first shot boundary line on the first metal layer;
   forming a gate insulating film on the gate wire;
   forming a semiconductor layer on the gate insulating layer;
   forming a semiconductor pattern by performing a second photo etching including divisional light exposure with at least two areas across at least one second shot boundary line on the semiconductor layer, the at least one second shot boundary line spaced apart from the at least one first shot boundary line;
   forming a second metal layer on the gate insulating film and the semiconductor pattern;
   forming a data wire including a data line, source and drain electrodes by performing a third photo etching including divisional light exposure with at least two areas across at least one third shot boundary line on the second metal layer, the at least one third shot boundary line spaced apart from the at least one first and second boundary lines;

forming a passivation film on the semiconductor pattern and the data wires;

forming a contact hole exposing the drain electrode by performing a fourth photo etching including divisional light exposure with at least two areas across at least one fourth shot boundary line on the passivation film, the at least one fourth shot boundary line spaced apart from the at least one first to third boundary lines;

forming a transparent conductive layer on the passivation film and the drain electrode; and forming a pixel electrode corrected to the drain electrode by performing a fifth photo etching including divisional light exposure with at least two areas across at least one fifth shot boundary line on the transparent conductive layer, the at least one fifth shot boundary line spaced apart from the at least one first to fourth boundary lines, wherein in the first to fifth photo etchings are performed by using first to fifth masks, respectively, each mask having a plurality of mask patterns;

wherein the mask patterns of at least two of the first to fifth masks have widths such that the number of shots in the light exposure using the at least two of the first to fifth masks are different from each other.

5. The method of claim 4, wherein each of the first to fifth mask comprises a first mask pattern defining an exposure area at a central portion of the substrate, and second and third mask patterns defining exposure areas at a left portion and a right portion of the substrate, respectively.

6. The method of claim 5, wherein widths of at least two of the first to third mask patterns in at least two of the first to fifth mask has two sub mask patterns.

7. The method of claim 4, further comprising:
forming a material layer for a black matrix on an opposite substrate facing the substrate; and
forming a black matrix by performing a sixth photo etching including divisional light exposure with at least two areas across at least one sixth shot boundary line on the material layer for a black matrix, the at least one sixth shot boundary line spaced apart from the at least one first to fifth boundary lines.

8. The method of claim 4, further comprising:
forming a transparent conductor layer on an opposite substrate facing the substrate; and forming a common electrode by performing a sixth photo etching including divisional light exposure with at least two areas across at least one sixth shot boundary line on the transparent conductor layer, the at least one sixth shot boundary line spaced apart from the at least one first to fifth boundary lines.

9. A method of forming patterns, comprising:

forming a first material layer;

forming a first pattern by performing a first photo etching including divisional light exposure with at least two areas across at least one shot boundary line on the first material layer;

forming a second material layer on the first pattern; and forming a second pattern by performing a second photo etching including divisional light exposure with at least two areas across at least one shot boundary line on the second material layer, the at least one shot boundary line in the second photo etching spaced apart from the at least one shot boundary line in the first photo etching, wherein the number of mask patterns for the first pattern is different from the number of mask patterns for the second pattern.

10. The method of claim 9, further comprising forming a material layer on the first and the second patterns; and forming a pattern by performing a photo etching including divisional light exposure with at least two areas across at least one shot boundary line on the material layer the at least one shot boundary line in the photo etching spaced apart from the at least one shot boundary line in to first photo etching and the at least one shot boundary line in the second photo etching.

11. The method of claim 10, wherein the formation of a material layer and the formation of a pattern are repeated to form a plurality of patterns.

12. The method of claim 10, wherein the first and second photo etchings are performed by using first and second masks, respectively, each mask having a plurality of mask patterns; and wherein widths of the mask patterns of the first and second masks are determined such that the number of shots for the first pattern is different from the number of shots for the second pattern.

* * * * *